(12) United States Patent
Bird

(10) Patent No.: US 7,739,525 B2
(45) Date of Patent: Jun. 15, 2010

(54) DEVICE AND SYSTEM FOR CONTROLLING PARALLEL POWER SOURCES COUPLED TO A LOAD

(75) Inventor: James G. Bird, Mont Vernon, NH (US)

(73) Assignee: Texas Instruments Incorporated, Dallas, TX (US)

( * ) Notice: Subject to any disclaimer, the term of this patent is extended or adjusted under 35 U.S.C. 154(b) by 823 days.

(21) Appl. No.: 11/525,407

(22) Filed: Sep. 22, 2006

(65) Prior Publication Data

US 2007/0188198 A1 Aug. 16, 2007

Related U.S. Application Data

(60) Provisional application No. 60/772,628, filed on Feb. 13, 2006.

(51) Int. Cl.
*G06F 1/26* (2006.01)
(52) U.S. Cl. .................................................... 713/300
(58) Field of Classification Search .................. 713/300
See application file for complete search history.

(56) References Cited

U.S. PATENT DOCUMENTS

| | | | | |
|---|---|---|---|---|
| 6,055,647 A | * | 4/2000 | Lacombe et al. | 714/14 |
| 6,421,215 B1 | * | 7/2002 | Bushue | 361/93.1 |
| 6,448,672 B1 | * | 9/2002 | Voegeli et al. | 307/52 |
| 7,030,771 B2 | * | 4/2006 | Kinnard et al. | 340/653 |
| 7,170,194 B2 | * | 1/2007 | Korcharz et al. | 307/21 |
| 7,265,955 B2 | * | 9/2007 | Fink | 361/42 |
| 7,272,733 B2 | * | 9/2007 | Pomaranski et al. | 713/320 |

\* cited by examiner

*Primary Examiner*—Chun Cao
(74) *Attorney, Agent, or Firm*—William B. Kempler; Wade J. Brady, III; Frederick J. Telecky, Jr.

(57) ABSTRACT

A device and system for controlling current from plural parallel power sources having inrush current hot-swapping capabilities to a load are disclosed. The current controlling device includes a load line for delivering currents from the outputs of the power sources; a current sensor for measuring the load current; and a common sense element for adjusting the load current levels.

28 Claims, 3 Drawing Sheets

US 7,739,525 B2

DEVICE AND SYSTEM FOR CONTROLLING PARALLEL POWER SOURCES COUPLED TO A LOAD

CROSS REFERENCE TO RELATED APPLICATIONS

This application claims the benefit of U.S. provisional patent application No. 60/772,628 filed on Feb. 13, 2006.

STATEMENT REGARDING FEDERALLY SPONSORED RESEARCH OR DEVELOPMENT (Not Applicable)

BACKGROUND OF THE INVENTION

A device and system for controlling load currents are disclosed and, more particularly, a device and system for controlling currents to a load from plural parallel power sources having hot swap capabilities.

"Hot swapping" refers to the ability of an electronic system or network of electronic systems to continue operating without interrupting the delivery of power to the system or network of systems after modules or components of the system or network, e.g., a hard drive, a power supply, a CD-ROM drive, and the like, are removed and replaced. Typically, during a hot swapping insertion, current to a load is ramped ON (or, alternatively, during extraction, current to a load is ramped OFF) in a controlled, linear manner to prevent disturbances on the power supply feed. This feature allows modules or components to be inserted into or extracted from a powered system without having to shut off power. Hot swap devices often include a current control function that prevents current to a load from exceeding a programmed maximum level. Thus, hot swapping reduces system down time and improves system availability.

High availability ("HA") systems are particularly desirable, especially in telecommunications. For example, the Advanced Telecom Computer Architecture ("ATCA") provides a common, high availability hardware platform for telecommunications systems. The standardized ATCA hardware platform includes a plurality of interconnected circuit boards and a chassis portion, or card shelf. By convention, each card shelf provides 14 or 16 slots for cards.

A scaled-down and less expensive version of the ATCA is the MicroTCA. MicroTCA supports smaller scale applications and is less powerful than ACTA but, otherwise, is similar in many respects. A major difference between the MicroTCA and the ATCA is that the MicroTCA does not include a carrier board.

Advantageously, both the ATCA and the MicroTCA are compatible with Advanced Mezzanine Cards ("AMCs"). AMCs are designed to be installed and to operate in a MicroTCA chassis or, alternatively, in an ATCA carrier board. AMCs are fully-managed intelligent cards that require hotswap protection. Hotswap circuitry for AMCs, however, is not on the AMC boards but, rather, is part of the MicroTCA power module or, alternatively, is part of the ATCA carrier board.

To improve the reliability of HA systems, redundant, parallel power sources are desirable. However, with plural power sources in parallel, the maximum current available to the load ("load current") is the sum of the output currents of each of the plural power sources. If all power sources are delivering current, the current level, typically, is unacceptably large. As a result, conventional power sources are not coupled in parallel in conjunction with ATCAs, MicroTCAs, and/or AMCs.

Therefore, it would be desirable to provide a system for controlling current levels from plural parallel power sources to a load and a device for the same. It would also be desirable to provide a device for use with plural parallel power sources that controls current rather than load shares.

BRIEF SUMMARY OF THE INVENTION

A device for controlling current from a plurality of parallel power sources to a load is disclosed. The device includes a load line for delivering a current to the load; a current sensing device, e.g., a low-impedance resistor or a current splitter, for measuring the current being delivered to the load; and a common sense element, e.g., a high-impedance resistor, for adjusting the current being delivered to the load by each of the plurality of parallel power sources. The load line is electrically coupled to and disposed between the output port of each of the plurality of parallel power sources and the load. The common sense element is electrically coupled to the current sense port of each of the plurality of parallel power sources.

In one aspect, each of the power sources has a hot swap capability for delivering inrush currents and the load is an advanced mezzanine card ("AMC") that is operationally associated with an Advanced Telecom Computer Architecture ("ATCA") or a Micro Telecom Computer Architecture ("Micro TCA").

In another aspect, the current sensing device includes an operating amplifier or other means that outputs a current to the common sense element via a current sense port. The current output by the operating amplifier or other means is directly proportional to the current being delivered to the load by the respective power source.

A system for controlling current to a load, e.g., an AMC that is operationally associated with an ATCA or a Micro TCA, is also disclosed. The system includes a plurality of parallel power sources that deliver current to the load and the current-controlling device described above.

BRIEF DESCRIPTION OF THE SEVERAL VIEWS OF THE DRAWINGS

The foregoing and other objects, features, and advantages of the invention will be apparent from the following Detailed Description of the Invention in conjunction with the Drawings of which.

DETAILED DESCRIPTION OF THE INVENTION

This application claims the benefit of U.S. provisional patent application No. 60/772,628 filed on Feb. 13, 2006, which is incorporated herein in its entirety by reference.

Figure 1:
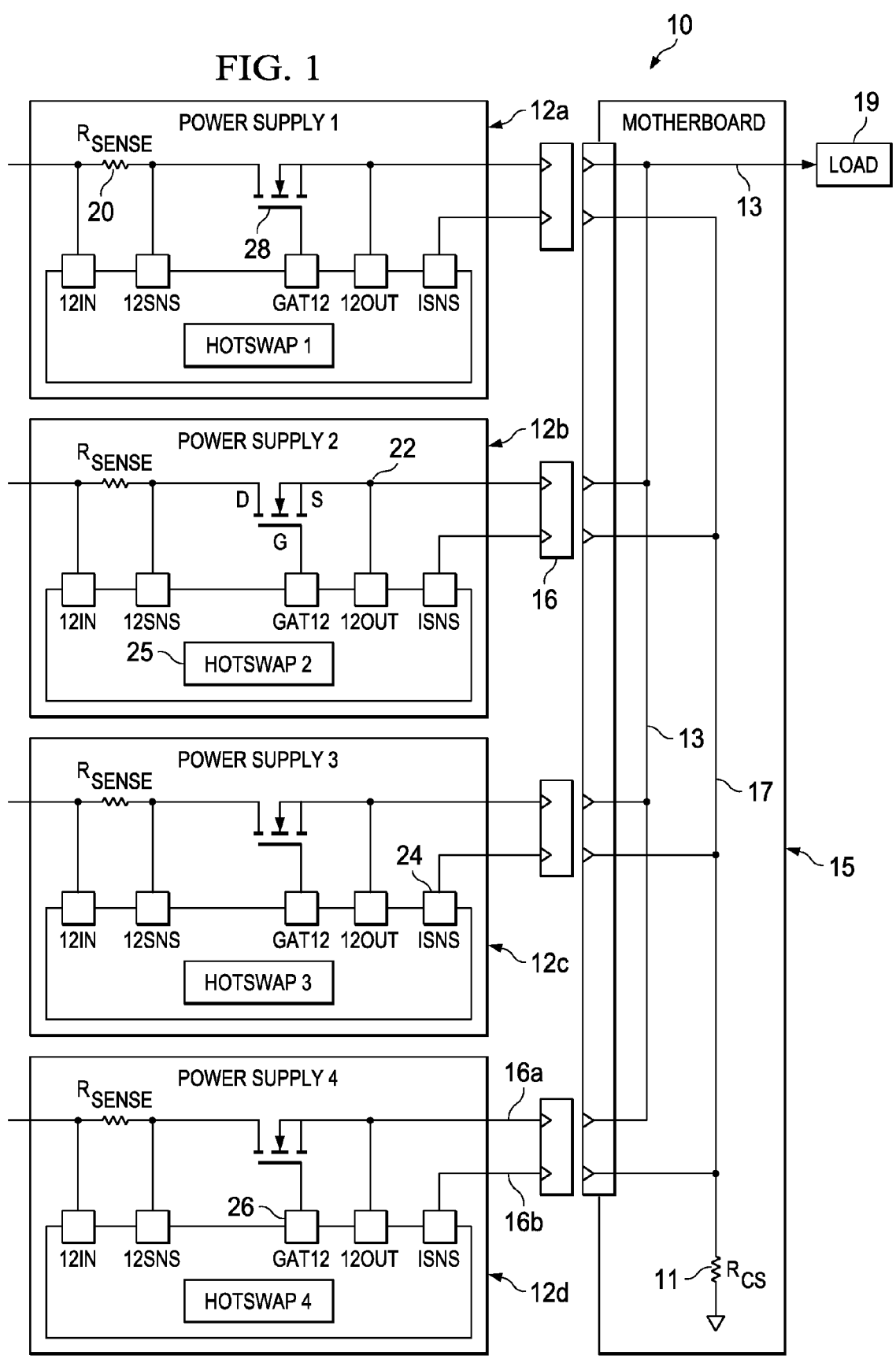
FIG. 1 is a diagram of plural parallel power sources having internal inrush controllers and control systems in accordance with the present invention.

A high-availability system for controlling the total load current from plural power sources having internal inrush controllers arranged in parallel to a load is disclosed. Referring to FIG. 1, the system 10 is shown to include a current-controlling device 28a-d and plural parallel power sources 12a to 12d. The current-controlling devices 28a-d are electrically-coupled to and disposed serially between the plural parallel power sources 12a to 12d, respectively, and a load 19, e.g., an AMC.

The current-controlling feedback device 15 includes plural input/output ("I/O") interfaces 16, or connections, and a high-impedance, common sense element 11, e.g., a high-impedance, common sense resistor. More particularly, each I/O interface 16 includes at least two ports 16a and 16b. The first ports 16a of each I/O interface are connected to the output ports 22 of each of the plural power sources 12a to 12d and to a load line 13. The second ports 16b of each I/O interface are connected to the current sense ports 24 of each of the plural power sources 12a to 12d and to a sense resistor line 17. The load line 13 leads to the load 19 and the sense resistor line 17 leads to a high-impedance, e.g., 10 kΩ, common sense element 11.

Each of the plural power sources 12a to 12d includes a hot swap inrush current controller 25, a current sensing device or current sensor 20, and a switching or control device 28. Hot swap inrush current controllers 25 are well known in the art and will not be discussed in detail herein. Furthermore, although, the current sensor 20 and/or the switching or control device 28 are described and shown herein as components of the power sources 12a to 12d, those skilled in the art will appreciate that the current sensor 20 and/or the switching or control device 28, alternatively, can be external to the power sources 12a to 12d, which is to say they can be components of the current-controlling device 15.

Figure 2:
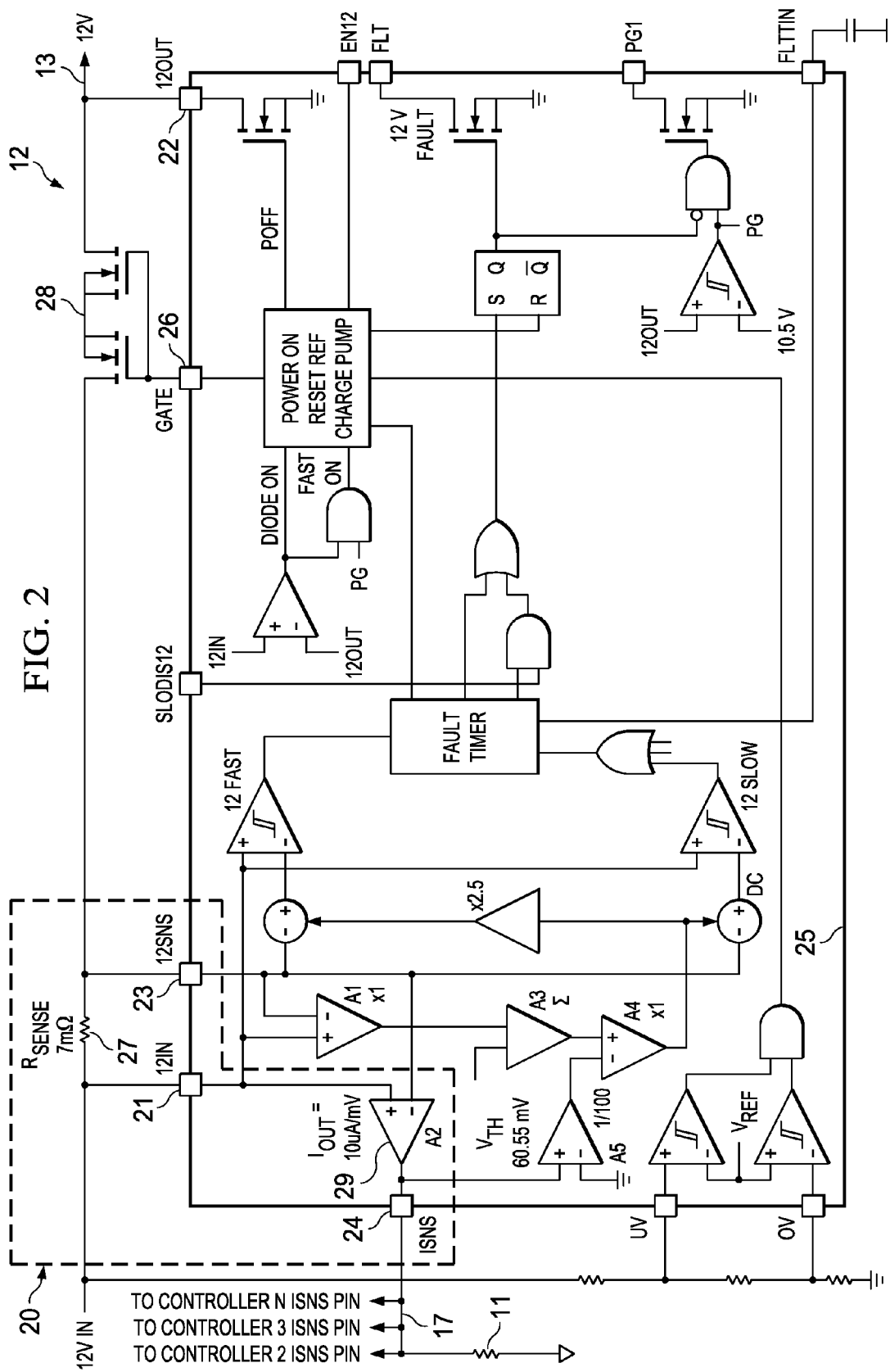
FIG. 2 is a circuit diagram of a current-sharing control system in accordance with the present invention.

Referring to FIG. 2, a power source 12 with a current sensor 20 in accordance with the present invention will be described. The timing and amount of current delivery to the load 19 from each power source 12 is controlled by the switching or control device 28, e.g., a field effect transistor ("FET"), a bi-polar junction transistor ("BJT"), a voltage OR diode, and the like. For convenience, the remainder of this disclosure will describe the switching device 28 of the invention as a FET or, more particularly, a metal-oxide semiconductor FET ("MOSFET").

MOSFETs 28 are three-terminal switching devices having a gate (G) electrode, a drain (D) electrode, and a source (S) electrode. Representative MOSFETs 28 can be n-channel or p-channel switching devices. MOSFETs 28 include an input voltage port, e.g., between the gate (G) and source (S) electrodes, and an output voltage port, e.g., between the drain (D) and source (S) electrodes. The input voltage port controls the flow of current between the drain (D) and the source (S) electrodes.

More specifically, when the gate-source input or biasing voltage ($v_{gs}$) is below a gate-source threshold voltage, there is no current flowing between the drain (D) and the source (S) electrodes. However, when the gate-source input or biasing voltage ($v_{gs}$) exceeds the threshold voltage, a controllable current ($i_d$) flows between the drain (D) and the source (S) electrodes. Once the gate-source input or biasing voltage ($v_{gs}$) saturates the MOSFET 28, a steady, constant or nearly constant current ($i_d$) is delivered.

The amount of current ($i_d$) flowing between the drain (D) and source (S) electrodes, which is to say, the amount of current ($i_d$) flowing from the power source 12 to the load 19, depends on the input or biasing voltage ($v_{gs}$) and on the output port voltage ($v_{ds}$). By increasing (or decreasing) the input or biasing voltage ($v_{gs}$), one can increase (or decrease) the source current ($i_d$) from the power source 12 to the load 19 until the MOSFET 28 becomes saturated. Here again, once the gate-source input or biasing voltage ($v_{gs}$) saturates the MOSFET 28, a steady, constant or nearly constant current ($i_d$) is delivered.

As current ($i_d$) passes through the switching device(s) 28 of the power source 12, it first passes through a low-impedance, e.g., 7 mΩ, sense element 27, e.g., a sense resistor in the current sensor 20. Consistent with Ohm's law, current passing through a resistive element causes a voltage drop that is proportional to the current (in amperes) times the resistance (in ohms). The current sensor 20 is structured and arranged to compare the source voltage immediately upstream of the sense element 27 with the voltage immediately downstream of the sense element 27, i.e., after the voltage drop.

Consistent with Ohm's and Kirchoff's laws, the voltage drop, or potential loss, through the relatively low-impedance, sense element 27 is proportional to the magnitude of the current passing through the sense element 27. Thus, the greater the current passing through the sense element 27, the greater the voltage drop and vice versa.

The current sensor 20 further includes a means, such as an operating amplifier ("OPAMP") 29, through which the upstream and downstream voltage levels are fed. For example, the upstream voltage level is input into the positive input port (+) of OPAMP 29 via current sensor input port 21 and the downstream voltage level is input into the negative input port (−) of OPAMP 29 via current sensor input port 23. The OPAMP 29 determines the voltage change (drop or loss) across the sense element 27, e.g., by subtracting the downstream voltage level at the negative input port (−) from the upstream voltage level at the positive input port (+).

The OPAMP 29 outputs a current ($I_{OUT}$) that is proportional to the voltage drop, e.g., in milli-volts ("mV") and, more specifically, that is proportional to the amount of current ($i_d$) that the particular power source 12 is delivering to the load 19. For illustrative purposes only, in FIG. 2, the output current ($I_{OUT}$) is equal to 10 µA per mV.

The output current ($I_{OUT}$) from the OPAMP 29 of each power source 12 is transmitted to ground via a current sense port 24, the sense element line 17, and the high-impedance, common sense element 11. The current-controlling device 10 measures the voltage drop associated with the output currents ($I_{OUT}$) passing through the high-impedance common sense element 11 and adjusts the amount of current ($i_d$) from each power source 12 going to the load 19, e.g., by increasing or decreasing the gate-source or biasing voltage ($v_{gs}$) of the switching device(s) 28. To prevent over-current from being delivered to the load 19, a predetermined maximum allowable current ($I_{MAX}$) and/or a predetermined maximum allowable voltage ($V_{MAX}$) for the high-impedance common sense element 11 can be fixed.

Figure 3:
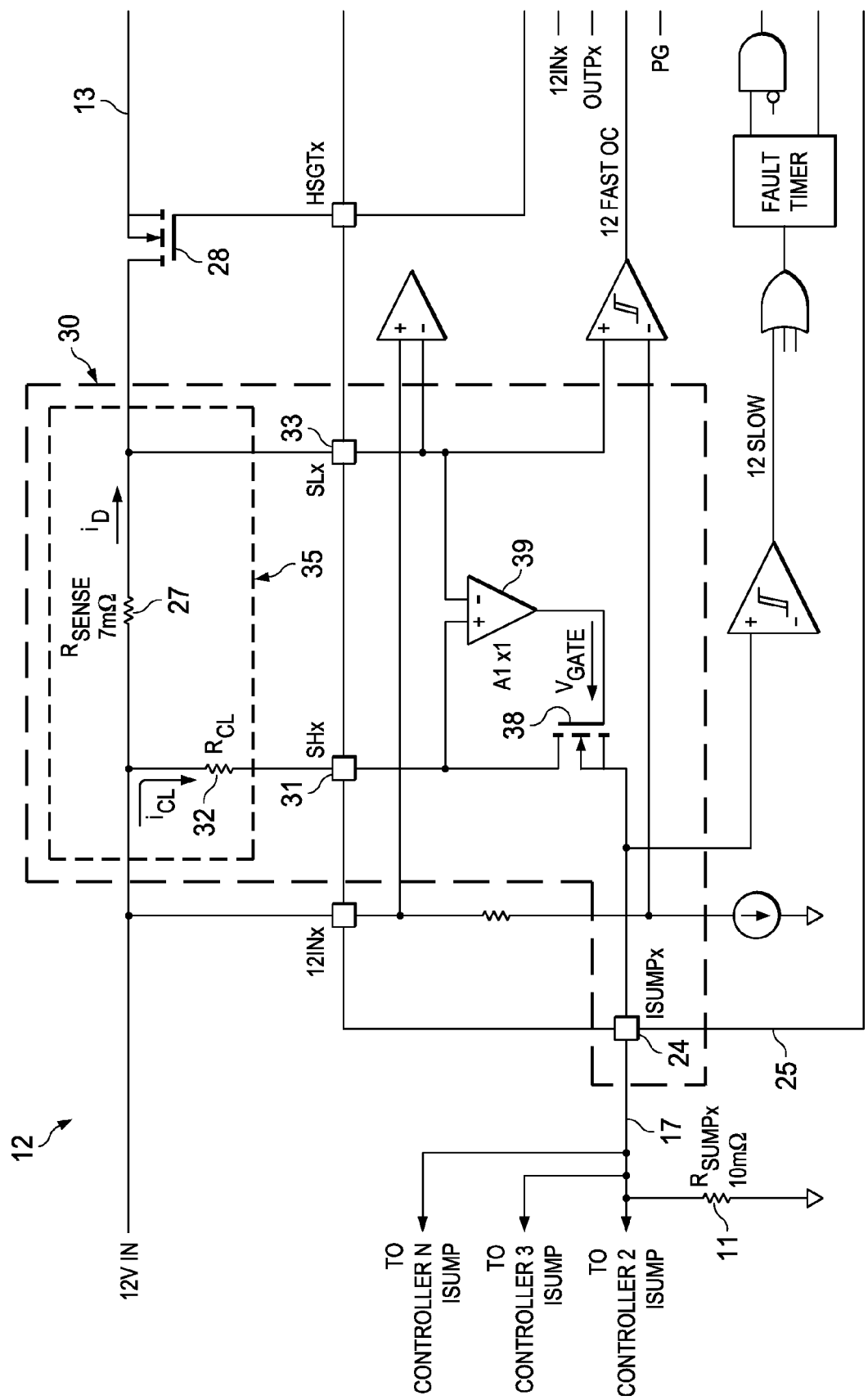
FIG. 3 is a circuit diagram of an alternative current-sharing control system in accordance with the present invention.

Another system 10 having an alternative current sensor 30 is shown in FIG. 3. As with the previously described current sensor 20, the timing and amount of current ($i_d$) delivered to the load 19 from each power source 12 is controlled by a switching device 28, e.g., a field effect transistor, a bi-polar junction transistor, a voltage OR diode, and the like.

In contrast with the previously described current sensor 20, the alternative current sensor 30 includes a current splitter 35. The current splitter 35 includes a relatively low-impedance, e.g., 7 mΩ, sense element 27, which is structured and arranged in parallel with a relatively high-impedance, e.g., 10 kΩ, current-controlling element ($R_{CL}$) 32. The impedance of the current-controlling element 32 is much greater than the impedance of the sense element 27. Consequently, the amount of current ($i_d$) passing through sense element 27 is greater than the amount of current ($i_{CL}$) passing through the current-controlling element 32.

As with current sensor 20, when the input or biasing voltage between the gate (G) and source (S) electrodes ($v_{gs}$) of the switching device 28 exceeds the threshold voltage, current ($i_d$) passes through the sense element 27 to the load 19. The magnitude of the current ($i_d$) to the load 19 for each power source 12 is controllable, e.g., by controlling the magnitude of the gate-source input or biasing voltage ($v_{gs}$).

As the name implies, with the current splitter 35, while a first portion of the total source current ($i_d$) passes through the sense element 27 to the load 19, a second portion of the total source current ($i_{CL}$) passes through the current-controlling resistor 32. Current ($i_{CL}$) passing through the current-controlling element 32 is output to the common sense element 11, e.g., via the current sense port 24.

Whether or not current ($i_{CL}$) passes through the current-controlling resistor 32 is controlled by a switching or control device 38, e.g., a FET, a BJT, a voltage OR diode, and the like, in the current sensor 30. More particularly, the current sensor 30 includes a means, such as an operating amplifier ("OPAMP") or comparator 39, that provides a gate-source input or biasing voltage ($V_{GATE}$) to the MOSFET 38, to control the amount of current ($i_{CL}$) passing through the current-controlling element 32 vis-à-vis the amount of current passing through the sense element 27 to the load 19.

The OPAMP 39 is structured and arranged to compare the line voltage at input port 31, i.e., immediately after the current-controlling element 32, with the voltage at input port 33, i.e., immediately downstream of the sense element 27. Instead of directly outputting current to the common sense element 11, the OPAMP 39, instead, outputs an input or biasing voltage ($V_{GATE}$) to the switching device 38.

When the input or biasing voltage ($V_{GATE}$) exceeds the threshold voltage of the switching device 38, current ($i_{CL}$) through the current-controlling element 32 is delivered to the common sense element 11 to ground, e.g., via the current sense port 24. The OPAMP 39 will continue to provide gate voltages ($V_{GATE}$) and the switching device 38 will continue to deliver current ($i_{CL}$) to the common sense element 11 until the voltage across the sense element 27 and the voltage across the current controlling element 32 are equal. Moreover, the amount of current ($i_{CL}$) to the common sense element 11 can be controlled by controlling the magnitude of the gate voltages ($V_{GATE}$).

The output current ($I_{OUT}$) from each power source 12 passes to ground via the current sense port 24, the sense element line 17, and the high-impedance common sense element 11 to ground. The current-controlling device 10 measures the voltage drop associated with the output currents ($I_{OUT}$) passing through the high-impedance common sense element 11 and adjusts the amount of current ($i_d$) from each power source 12 going to the load 19, e.g., by increasing or decreasing the gate input or biasing voltage ($v_{gs}$) of the switching device 28 and/or by increasing or decreasing the gate input or biasing voltage ($v_{gs}$) of the switching device 38 in the current sensor 30. To prevent over-current from being delivered to the load 19, a predetermined maximum allowable current ($I_{MAX}$) and/or a predetermined maximum allowable voltage ($V_{MAX}$) for the high-impedance common sense element 11 can be fixed.

It will be apparent to those of ordinary skill in the art that modifications to and variations of the above-described system and method may be made without departing from the inventive concepts described herein. Accordingly, the invention should not be controlled except by the scope and spirit of the appended claims.

What I claim is:

1. A device for use in each of a plurality of parallel-connected power sources for controlling current delivered to a load, the device comprising:

a current controlling circuit in the power source for controlling the current delivered to the load by the respective power source;

a current sensor for measuring the current delivered to the load by the respective power source, the current sensor including a circuit generating a current proportional to the current delivered to the load by the respective power source; and an output port adapted for providing the current proportional to the load to a common impedance element, whereby currents proportional to respective load currents from the plurality of power sources are provided to the common impedance element in parallel to generate a common current control signal, the common current control signal being coupled to the current controlling circuit.

2. The device as recited in claim 1, wherein each of the plurality of parallel power sources has a hot swap capability for delivering inrush currents.

3. The device as recited in claim 1, wherein the load is an advanced mezzanine card or a load being fed by the plurality of power sources.

4. The device as recited in claim 3, wherein the advanced mezzanine card is operationally associated with an Advanced Telecom Computer Architecture or a Micro Telecom Computer Architecture.

5. The device as recited in claim 1, wherein the current sensor includes a low-impedance element that measures the current being delivered to the load.

6. The device as recited in claim 1, wherein the common impedance element is a high-impedance element.

7. The device as recited in claim 1, wherein voltage across the common impedance element is used to adjust the current delivered to the load by each of the plurality of parallel power sources.

8. The device as recited in claim 7, wherein the current delivered to the load by each of the plurality of parallel power sources is controlled to fall below a predetermined maximum allowable load current.

9. The device as recited in claim 1, wherein the current sensor includes a current splitter having a first sensing element in parallel with a second sensing element.

10. The device as recited in claim 9, wherein current delivered to the load passes through the first sensing element and current to the common impedance element passes through the second sensing element.

11. The device as recited in claim 9, wherein the current sensor comprises means for adjusting the current to the common impedance element by controlling a switching device electrically coupled to the second sensing element.

12. The device as recited in claim 11, wherein said means for adjusting adjusts current to the common impedance element until a voltage across the first sensing element is equal to a voltage across the second sensing element.

13. The device as recited in claim 1, wherein the current sensor includes a current splitter having a first sensing element in parallel with a second sensing element; and
wherein current delivered to the load passes through the first sensing element and current to the common impedance element passes through the second sensing element.

14. A system for controlling power to a load from a plurality of parallel-connected power sources comprising:
a plurality of power sources coupled in parallel to a load, each of the power sources comprising a current controlling circuit, the current controlling circuit generating a current proportional to current delivered to the load; and an impedance element coupled to receive the current proportional to current delivered to the load from the plurality of power sources for generating a voltage proportional to the current delivered to the load, the voltage being coupled to the current controlling circuit in each of the plurality of current sources.

15. The system as recited in claim 14, wherein each of the plurality of parallel power sources has a hot swap capability for delivering inrush currents.

16. The system as recited in claim 14, wherein the load is an advanced mezzanine card or a load being fed by the plurality of power sources.

17. The system as recited in claim 16, wherein the advanced mezzanine card is operationally associated with an Advanced Telecom Computer Architecture or a Micro Telecom Computer Architecture.

18. The system as recited in claim 14, wherein the current sensor includes means for outputting a current to the common sense element via a current sense port.

19. The system as recited in claim 18, wherein current output by said means is directly proportional to the current being delivered to the load.

20. The system as recited in claim 14, wherein the current sensor includes a low-impedance element that measures the current being delivered to the load.

21. The system as recited in claim 14, wherein voltage across the common impedance element is used to adjust the current delivered to the load by each of the plurality of parallel power sources.

22. The system as recited in claim 21, wherein the current delivered to the load by each of the plurality of parallel power sources is controlled to fall below a predetermined maximum allowable load current.

23. The system as recited in claim 14, wherein the current sensor includes a current splitter having a first sensing element in parallel with a second sensing element.

24. The system as recited in claim 23, wherein the first sensing element is a sensing element that is in a path that delivers current to the load and the second sensing element is a current-controlling element that delivers current to the common impedance element.

25. The system as recited in claim 23, wherein the current sensor comprises means for adjusting the current to the common impedance element by controlling a switching device electrically coupled to the second sensing element.

26. The system as recited in claim 25, wherein said means adjusts current to the common impedance element until a voltage across the first sensing element is equal to a voltage across the second sensing element.

27. In a system for controlling power to a load from a plurality of parallel-connected power sources and having a common impedance element, a power source controlling device in each power source comprising:
    a current controlling circuit generating a first current related to the current supplied to the load from the respective power source, and supplying the first current to an output configured to be coupled to the common impedance element; and
    means for monitoring voltage generated across the common impedance element and for controlling the current supplied to the load from the respective power source.

28. The system of claim 27 wherein power sources in the plurality of power sources each coupled their respective first currents to the common impedance element in parallel.

* * * * *